United States Patent
Kim

(10) Patent No.: US 8,355,089 B2
(45) Date of Patent: Jan. 15, 2013

(54) LIQUID CRYSTAL DISPLAY DEVICE AND FABRICATION METHOD THEREOF

(75) Inventor: You-Jin Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 317 days.

(21) Appl. No.: 11/476,092

(22) Filed: Jun. 28, 2006

(65) Prior Publication Data

US 2007/0153150 A1 Jul. 5, 2007

(30) Foreign Application Priority Data

Dec. 29, 2005 (KR) .................. 10-2005-0134389

(51) Int. Cl.
*G02F 1/136* (2006.01)
*G02F 1/13* (2006.01)

(52) U.S. Cl. .................. 349/47; 349/43; 349/187

(58) Field of Classification Search .............. 349/43, 349/47; 257/59
See application file for complete search history.

(56) References Cited

U.S. PATENT DOCUMENTS

| | | | |
|---|---|---|---|
| 6,476,418 B1 * | 11/2002 | Shiga et al. ............ | 257/72 |
| 6,559,906 B1 * | 5/2003 | Kawachi et al. ......... | 349/47 |
| 6,917,392 B2 * | 7/2005 | Hannuki et al. ......... | 349/43 |
| 7,161,212 B2 * | 1/2007 | Ohishi et al. ........... | 257/347 |
| 7,511,301 B2 * | 3/2009 | Kimura .................. | 257/72 |
| 2002/0004108 A1 * | 1/2002 | Iwakabe et al. ......... | 428/1.1 |
| 2003/0218699 A1 * | 11/2003 | Park et al. .............. | 349/43 |
| 2005/0134755 A1 * | 6/2005 | Yang et al. ............. | 349/43 |
| 2005/0157222 A1 * | 7/2005 | Tanaka et al. .......... | 349/43 |
| 2005/0242352 A1 | 11/2005 | Jeoung et al. .......... | 257/66 |

FOREIGN PATENT DOCUMENTS

| | | |
|---|---|---|
| CN | 1693972 A | 11/2005 |
| JP | 8-330592 | 12/1996 |

* cited by examiner

*Primary Examiner* — Mark Robinson
*Assistant Examiner* — Charles Chang
(74) *Attorney, Agent, or Firm* — Morgan, Lewis & Bockius LLP

(57) ABSTRACT

A method for fabricating a liquid crystal display device including forming an active pattern on a substrate, the active pattern including lateral surface partially having a non-planar shape, forming a gate electrode on the active pattern, the gate electrode crossing the lateral surfaces of the active pattern, forming a source electrode and a drain electrode electrically connected to predetermined regions of the active pattern, and forming a pixel electrode electrically connected to the drain electrode.

2 Claims, 8 Drawing Sheets

LIQUID CRYSTAL DISPLAY DEVICE AND FABRICATION METHOD THEREOF

The present invention claims the benefit of Korean Patent Application No. 134389/2005 filed in Korea on Dec. 29, 2005, which is hereby incorporated by reference.

BACKGROUND OF THE INVENTION

1. Field of the Invention

The present invention relates to a liquid crystal display device and a fabrication method thereof, and more particularly, to a liquid crystal display device and a fabrication method thereof with an improved yield by preventing disconnection between conductive layers, and a fabrication method thereof.

2. Discussion of the Related Art

Recently, information displays including portable information displays have drawn great attention. Accordingly, thin and light-weight flat panel display (FPD) devices have been actively researched and commercialized to replace existing cathode ray tubes (CRTs). In particular, among various FPD devices, liquid crystal display (LCD) devices have been widely used as a device for displaying images by using optical anisotropic properties of liquid crystals. For example, LCD devices are currently used in notebook computers and desktop monitors due to their superior resolution, color rendering capability, and image quality.

An LCD device generally includes a first substrate (e.g., a color filter substrate), a second substrate (e.g., an array substrate), and a liquid crystal layer disposed between the two substrates. FIG. 1 is a perspective view schematically showing a related art LCD device. As shown in FIG. 1, the LCD device includes a color filter substrate 5, an array substrate 10, and a liquid crystal layer 40 disposed between the color filter substrate 5 and the array substrate 10. The color filter substrate 5 includes a color filter C having a plurality of sub-color filters 7 for rendering colors R (Red), G (Green) and B (Blue). Also, the color filter substrate 5 has a black matrix 6 disposed between the sub-color filters 7 for preventing light from being transmitted through the liquid crystal layer 40, and a transparent common electrode 8 for applying a voltage to the liquid crystal layer 40. The array substrate 10 includes a plurality of gate lines 16 and data lines 17 arranged in horizontal and vertical directions, respectively. The gate lines 16 and data lines 17 define a plurality of pixel regions P, and pixel electrodes 18 are formed on the pixel regions P. Thin film transistors T, which are used as switching devices, are formed at each intersection between the gate lines 16 and data lines 17. The color filter substrate 5 and the array substrate 10 having such construction are bonded facing each other by a sealant (not shown) formed at a periphery of an image display region to form an LCD panel. The color filter substrate 5 and the array substrate 10 are bonded to each other by use of a bonding key (not shown) formed on either the color filter substrate 5 or the array substrate 10.

During fabrication, various layers are formed on the respective substrates to construct the LCD device. For instance, an upper layer is usually arranged on top of a lower layer sometimes crossing the lower layer. When a taper, i.e. an inclined angle of the lower layer is formed improperly, a disconnection may occur between the upper layer and the lower layer during patterning of the upper layer.

FIGS. 2A through 2C are plane views showing sequential processes of a pattern forming method according to the related art that illustrates forming a gate electrode on an active pattern. In addition, FIGS. 3A through 3C are cross-sectional views showing the sequential processes of the pattern forming method according to the related art. In particular, the cross-sectional views are taken along the line A-A' of FIGS. 2A through 2C, and sequentially illustrate the pattern forming method shown in FIGS. 2A through 2C.

As shown in FIGS. 2A and 3A, an active pattern 24, which is formed of a thin silicon film, is formed on a substrate 10. As shown in FIGS. 2B and 3B, an insulating film 15A and a conductive layer 20 are sequentially deposited on an entire surface of the substrate 10. Here, when the taper of the active pattern 24, i.e. the lower layer, is properly formed, the conductive layer 20, i.e. the upper layer, is deposited properly. The term "taper" is to be construed as an inclined angle of a patterned layer. Conversely, when the taper of the active pattern 24 is improperly formed, a void V is formed at an interface between the conductive layer 20 and the active pattern 24. When a void V is formed, an etching solution may flow into the void V during photolithographic patterning process of the conductive layer 20. As a result, the etching solution may cause a disconnection D in the gate electrode 21 upon patterning the gate electrode 21, as shown in FIGS. 2C and 3C. In particular, the disconnection D in the upper layer is frequently caused when the upper layer is formed by wet etching with the taper of the lower layer being improperly formed.

SUMMARY OF THE INVENTION

Accordingly, the present invention is directed to a liquid crystal device and fabrication method thereof that substantially obviates one or more of the problems due to limitations and disadvantages of the related art.

An object of the present invention is to provide a liquid crystal display (LCD) device with increased reliability.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, there is provided a method for fabricating an array substrate for a liquid crystal display device comprising:

forming an active pattern on a substrate; forming a first insulating layer on the substrate; forming a gate electrode on the first insulating layer, the gate electrode crossing the active pattern, wherein the active pattern has sawtooth shape; forming a second insulating layer on the substrate; forming a source electrode and a drain electrode connected to the active pattern; and forming a pixel electrode connected to the drain electrode.

To achieve these and other advantages and in accordance with the purpose of the present invention, an array substrate for a liquid crystal display device comprising:

an active pattern formed on a substrate; a first insulating layer formed on the substrate; a gate electrode formed on the first insulating layer, wherein the active pattern has sawtooth shape; a second insulating layer formed on the substrate; source electrode and drain electrode formed on the substrate, and connected to the active pattern; and a pixel electrode connected to the drain electrode.

To achieve these and other advantages and in accordance with the purpose of the present invention, a liquid crystal display device comprising a color filter substrate, an array substrate, and a liquid crystal layer therebetween, the array substrate comprising: an active pattern formed on a substrate; a first insulating layer formed on the substrate; a gate electrode formed on the first insulating layer, wherein the active pattern has sawtooth shape; a second insulating layer formed on the substrate; source electrode and drain electrode formed on the substrate, and connected to the active pattern; and a pixel electrode connected to the drain electrode.

To achieve these and other advantages and in accordance with the purpose of the present invention, a method for forming an upper layer and a lower layer which cross each other on a substrate comprising: forming the lower layer on the substrate, the lower layer has sawtooth shape; forming the upper layer on the lower layer with crossing the lower layer; and patterning the upper layer by etching.

To achieve these and other advantages and in accordance with the purpose of the present invention, a method for fabricating a liquid crystal display device comprising: providing a color filter substrate and an array substrate, and forming a liquid crystal layer between the color filter substrate and the array substrate; wherein providing the array substrate comprises: forming a gate electrode on a substrate; forming a first insulating layer on the gate electrode; forming an active pattern on the first insulating layer, the active pattern crossing the gate electrode, wherein the gate electrode has sawtooth shape; forming a second insulating layer on the active pattern; forming a source electrode and a drain electrode connected to the active pattern; forming a pixel electrode connected to the drain electrode.

To achieve these and other advantages and in accordance with the purpose of the present invention, an array substrate for a liquid crystal display device comprising: a gate electrode formed on a substrate; a first insulating layer formed on the gate electrode; an active pattern formed on the first insulating layer, wherein the gate electrode has sawtooth shape; a second insulating layer formed on the active pattern; source electrode and drain electrode formed on the second insulating layer, and connected to the active pattern; and a pixel electrode connected to the drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a portion of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings. Although the exemplary embodiments show a gate electrode being formed on an active pattern, but the present invention is not limited thereto. The present invention may be applicable to any device that requires forming an upper layer on a certain lower layer using wet etching.

Figure 1:
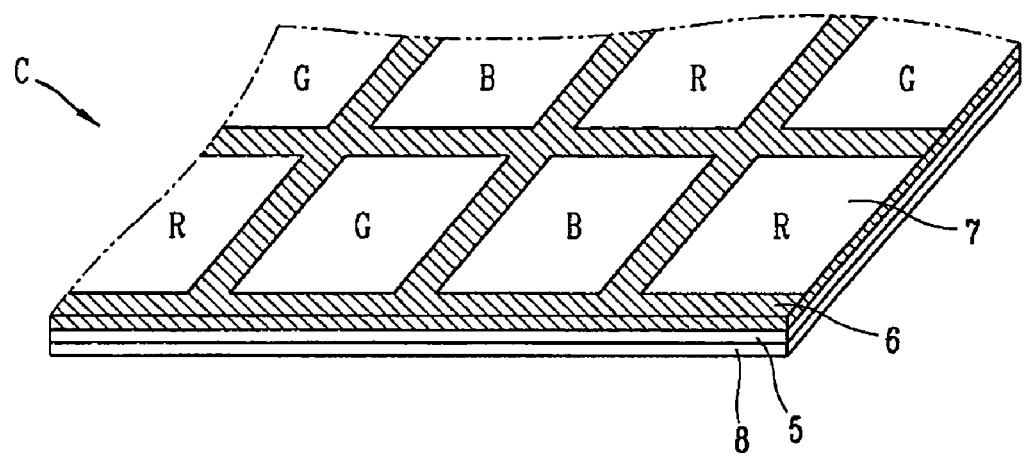
FIG. 1 is a perspective view schematically showing a structure of a related art liquid crystal display (LCD) device.
Figure 1:
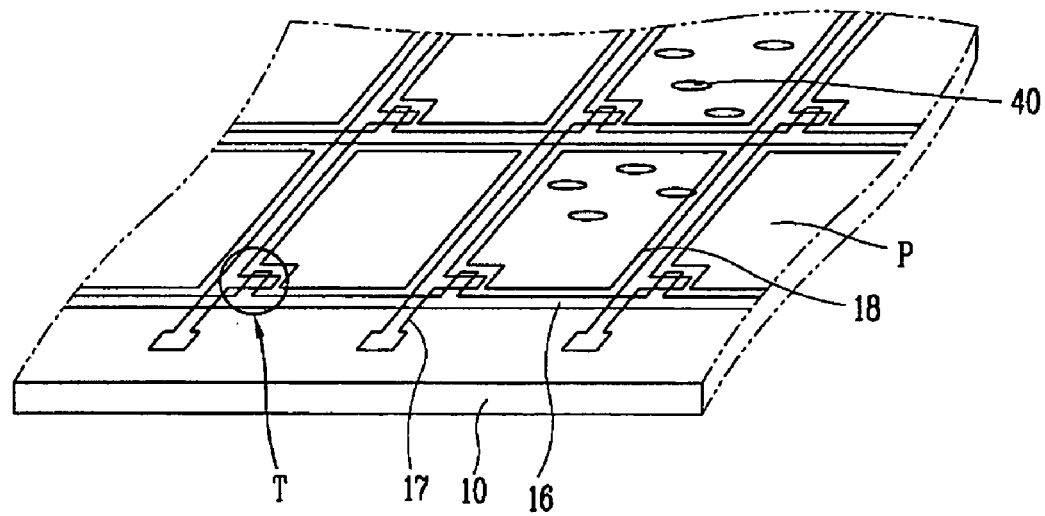
Figure 2A:
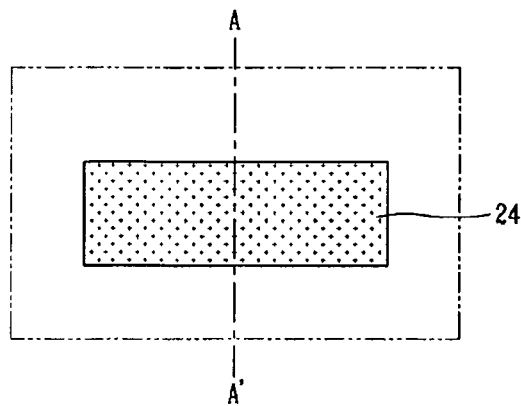
FIGS. 2A through 2C are plane views along line A-A' of FIGS. 2A through 2C, respectively, sequentially showing pattern forming method of the related art.
Figure 2B:
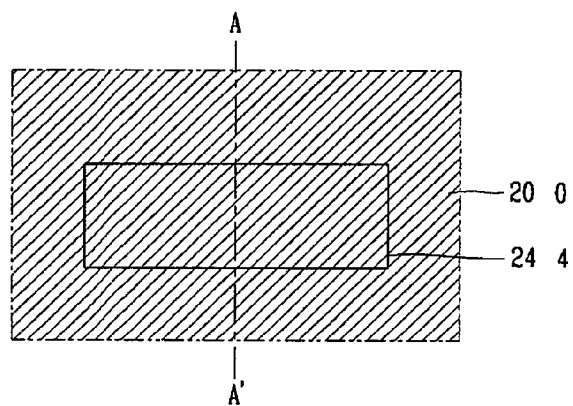
Figure 2C:
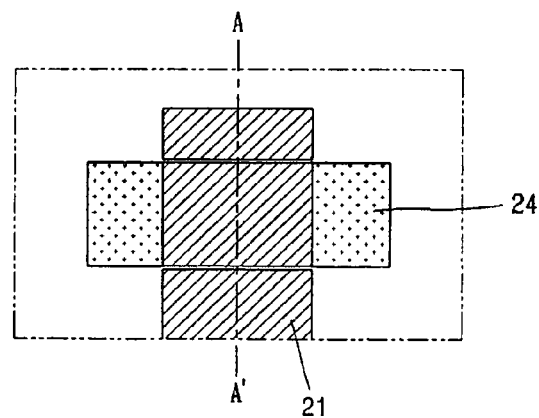
Figure 3A:
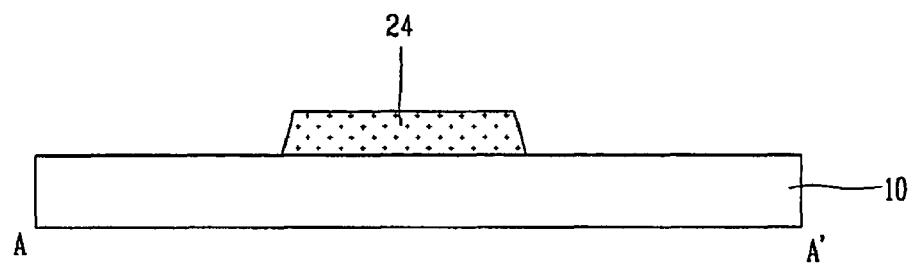
FIGS. 3A through 3C are sectional views sequentially showing the related art pattern forming method.
Figure 3B:
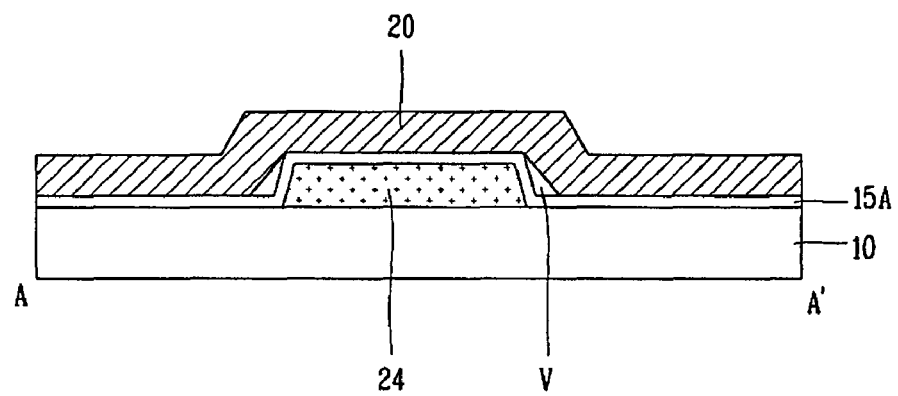
Figure 3C:
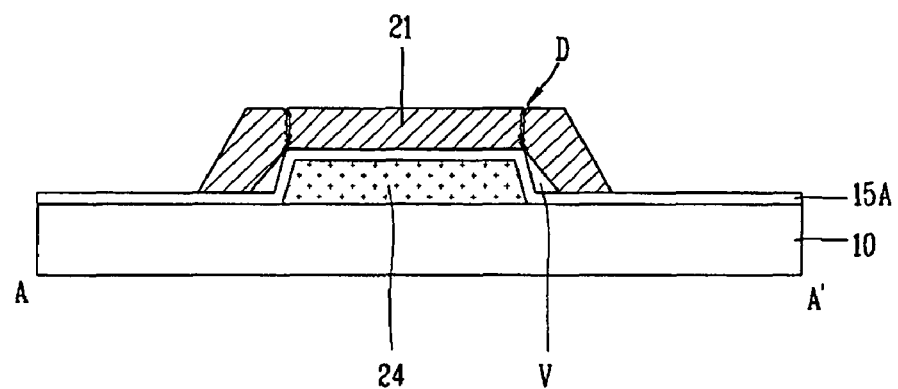
Figure 4A:
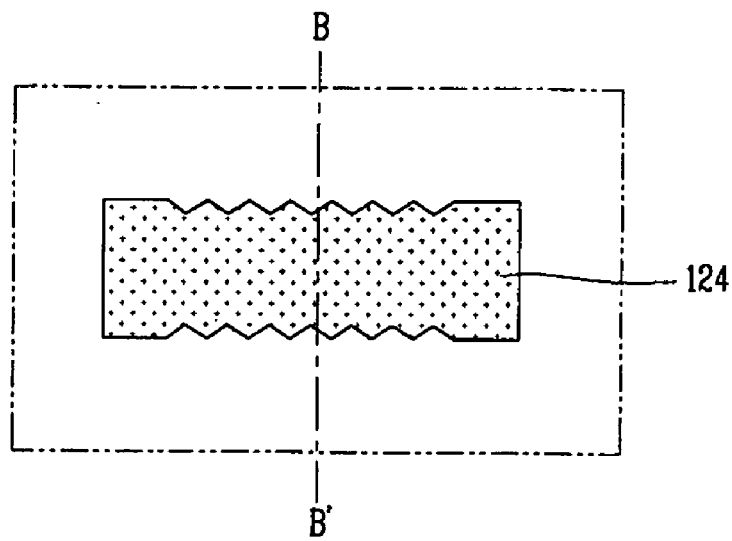
FIGS. 4A and 4B are plane views sequentially showing a pattern forming method according to an exemplary embodiment of the present invention.
Figure 4B:
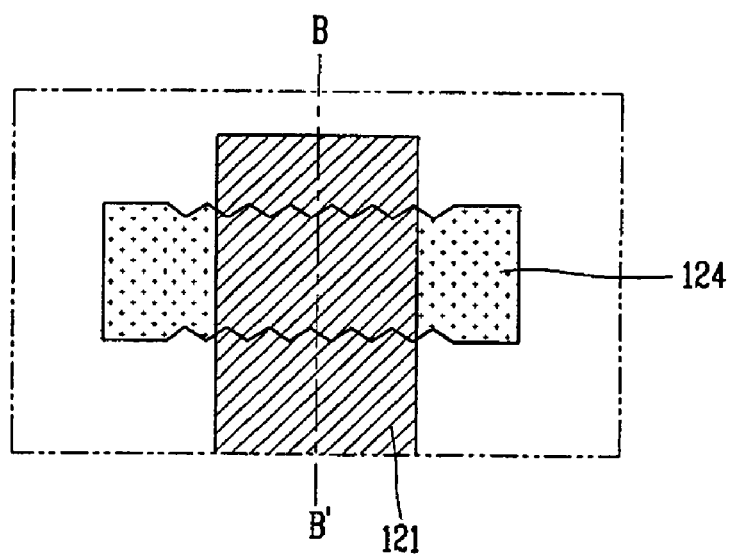
Figure 5A:
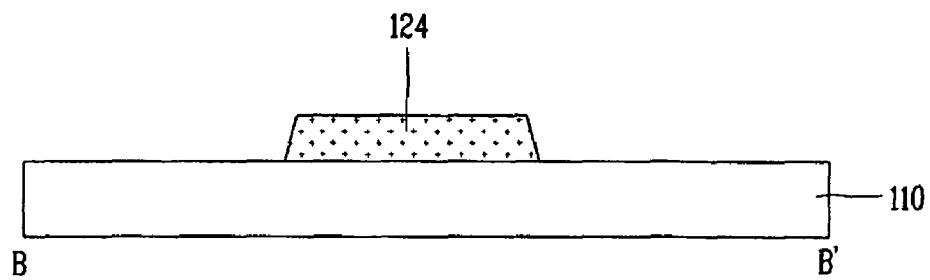
FIGS. 5A and 5B are sectional views align line B-B' of FIGS. 4A and 4B, respectively, sequentially showing the pattern forming method according to the exemplary embodiment of the present invention.
Figure 5B:
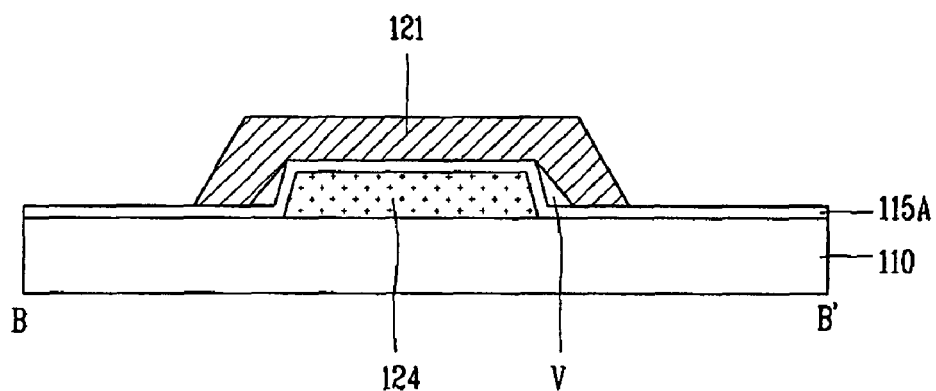

FIGS. 4A and 4B are plane views sequentially showing a pattern forming method according to an exemplary embodiment of the present invention. Also, FIGS. 5A and 5B are sectional views sequentially showing the pattern forming method according to the exemplary embodiment of the present invention. The sectional views in FIGS. 5A and 5B are taken along the line B-B' of FIGS. 4A and 4B, respectively.

As shown in FIGS. 4A and 5A, an active pattern 124, which may formed of a thin silicon film, is disposed on a substrate 110. Both sides of the active pattern 124 are patterned to have a sawtooth shape. In this example, the sides are formed in a triangular shape. Further, as shown in FIG. 5B, an insulating layer 115A and a conductive layer (not shown) are sequentially deposited on an entire surface of the substrate 110.

When the taper of the active pattern 124 (i.e., the lower layer) is formed properly, the conductive layer (i.e., the upper layer) is deposited properly on the active pattern 124. On the other hand, when the taper of the active pattern 124 is improperly formed, a void V may be formed at an interface between the active pattern 124 and the conductive layer. Again, the term "taper" is to be construed as an inclined angle of a patterned layer.

Although the void V is formed at the interface between the active pattern 124 and the conductive layer, since the active pattern 124 is patterned to have a sawtooth shape, the flow path of an etching solution within the void V is lengthened. Therefore, it is possible to prevent a disconnection from occurring in a gate electrode 121 during patterning. In other words, the sawtoothed pattern of the lateral surfaces of the active pattern 124 lengthens the path through which the etching solution is introduced during the patterning of the gate electrode 121. The lengthened flow path prevents the etchant from flowing across the full length of the void V to cause a break in the upper layer. Accordingly, the disconnection in the entire gate electrode 121 may be prevented even when the void V is formed at the interface between the active pattern 124 and the conductive layer.

Figure 6:
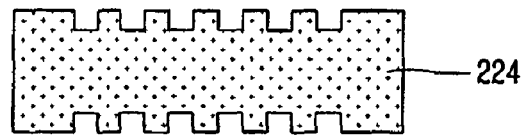
FIG. 6 is a plane view schematically showing a different shape of lower layer pattern according to another exemplary embodiment of the present invention.

Specifically, this effect is primarily due to the extended flow path of the etching solution. Therefore, the pattern of the lower layer, in this case the active pattern 124, for extending the flow path of the etching solution may have various shapes. That is, any shape that extends the flow path of the etching solution is suitable for the purpose of the present invention. Although patterns with different shapes in the lower layer may lead to different characteristics in the thin film transistor and other components formed therefrom, various pattern shapes in the lower layer generally extending the flow path of the etching solution prevent disconnections that can decrease performance. In other words, while the shape of the pattern in the lower layer typically depends on its intended function, the presence of a pattern extending the flow path of the etching solution in the lower layer prevents disconnections. FIG. 6 is a plane view schematically a lower layer having a different shape according to another exemplary embodiment of the present invention. In this embodiment, the active pattern 224 has a square sawtooth shape.

The disconnection may occur directly between the upper layer and the lower layer. Further the disconnection can occur even when an insulating layer is disposed between the upper layer and the lower layer, as shown in the present invention. Also, the disconnection may be increased or decreased according to the deposition of the insulating layer. Therefore, the pattern shape of the lower layer can be determined according to the type of the material disposed between the upper layer and the lower layer.

Figure 7:
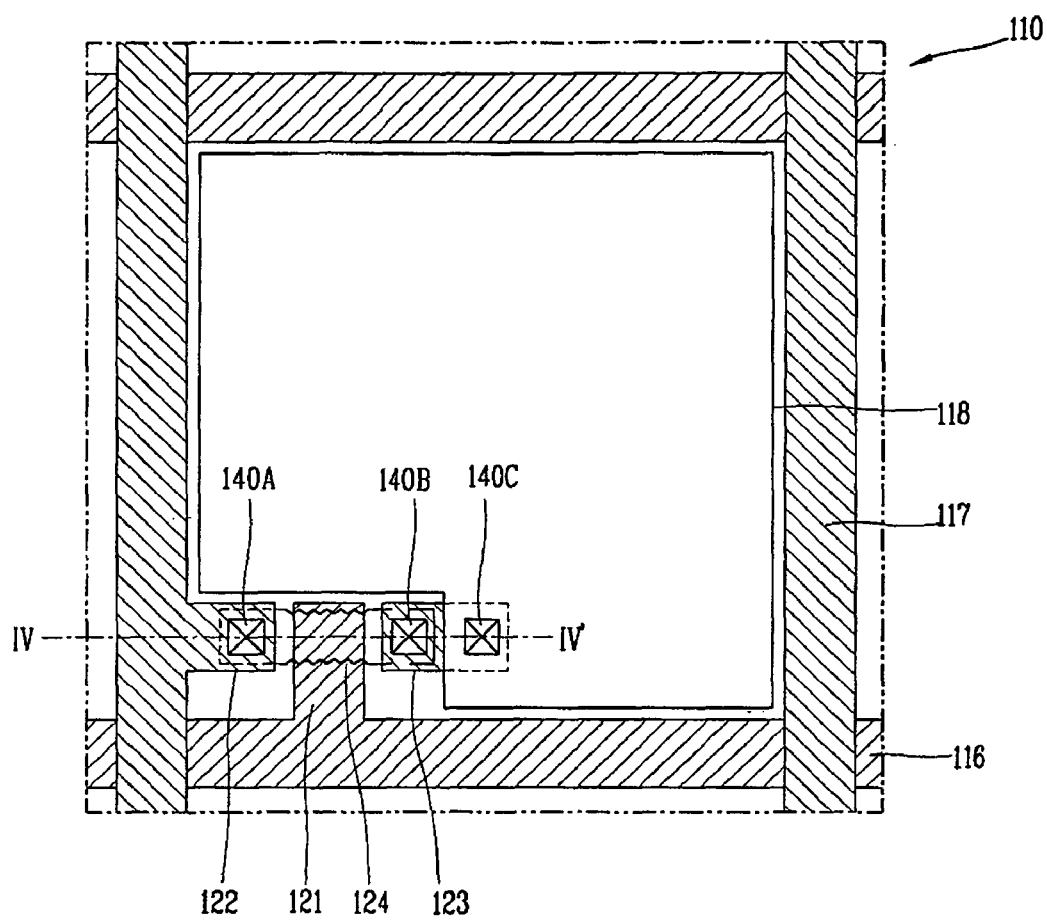
FIG. 7 is a plane view partially showing an array substrate of an LCD device according to an exemplary embodiment of the present invention.

FIG. 7 is a plane view partially showing an array substrate of an LCD device according to an exemplary embodiment of the present invention. In particular, FIG. 7 shows one pixel including a thin film transistor. In practice, an LCD device includes N×M numbers of pixels defined by N gate lines and M data lines crossing each other. For purposes of example only, FIG. 7 shows only one pixel for simplicity.

An exemplary embodiment of the present invention includes a polycrystalline silicon thin film transistor using a polycrystalline silicon thin film as a channel layer. However, the present invention is not limited thereto. For example, the present invention may employ an amorphous silicon thin film as the channel layer of the thin film transistor. In addition, the exemplary embodiment of the present invention uses a pattern forming method of stacking the gate electrode (i.e., the upper layer) on the active pattern (i.e., the lower layer). However, the gate electrode may be formed below the active pattern 124 without departing from the scope of the invention. As shown in FIG. 7, an array substrate 110 is provided with gate lines 116 and data lines 117 which are arranged horizontally and vertically on the array substrate 110 to define pixel regions. A thin film transistor TFT, which is used as a switching device, is formed at each intersection between the gate line 116 and the data line 117. A pixel electrode 118, which is formed within each pixel region, is connected to the thin film transistor to drive both a common electrode of a color filter substrate (not shown) and liquid crystals (not shown).

The thin film transistor includes a gate electrode 121 connected to the gate line 116, a source electrode 122 connected to the data line 117, and a drain electrode 123 connected to the pixel electrode 118. The thin film transistor also includes a first and a second insulating layer (not shown) for insulating the gate electrode 121, the source electrode 122, the drain electrode 123, and the active pattern 124. The active pattern 124 forming a conductive channel between the source electrode 122 and the drain electrode 123 by a gate voltage supplied to the gate electrode 121. Here, a portion of the source electrode 122 is electrically connected to a source region of the active pattern 124 through a first contact hole 140A formed in the first and second insulating layers (not shown). Also, a portion of the drain electrode 123 is electrically connected to a drain region of the active pattern 124 through a second contact hole 140B. Another portion of the source electrode 122 is extended in the direction opposite to the first contact hole 140A to form a portion of the data line 117. Further, another portion of the drain electrode 123 is extended toward the pixel region to be electrically connected to the pixel electrode 118 through a third contact hole 140C formed in a third insulating layer (not shown).

As aforementioned, both lateral surfaces of the active pattern 124 over which the gate electrode 121 passes have sawtooth shapes. Accordingly, a disconnection of the gate electrode 121, which can occur when patterning the gate electrode 121, can be prevented.

The process for fabricating an LCD device according to the exemplary embodiment of the present invention will now be explained in detail. FIGS. 8A through 8F are sectional views of FIG. 7 taken along the line IV-IV', sequentially showing the exemplary fabrication process of the array substrate.

Figure 8A:
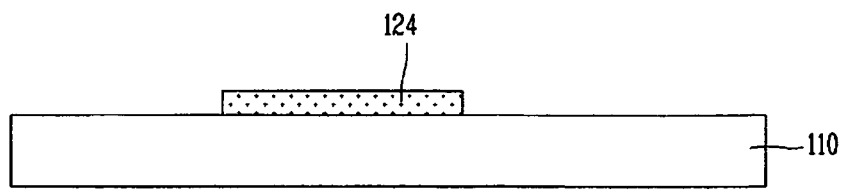
FIGS. 8A through 8F are sectional views taken along the line IV-IV', which sequentially showing an exemplary fabrication process of the array substrate shown in FIG. 7.

As shown in FIG. 8A, a photolithography process, for example, is used to form an active pattern 124 on a substrate 110. In this example, the active pattern 124 is formed of a silicon layer and the substrate 110 is formed of a transparent insulating material (e.g., glass). Here, a buffer layer (not shown) formed of a silicon dioxide layer $SiO_2$ may first be formed on the substrate 110 before the active pattern 124 is formed. The buffer layer prevents impurities, such as natrium (Na) existing within the glass substrate 110, from being introduced into the upper layer (i.e., active pattern 124). The active pattern 124 may be formed of an amorphous silicon thin film or a crystallized silicon thin film. In an exemplary embodiment of the present invention, the thin film transistor is formed of a crystallized polycrystalline silicon thin film. In this exemplary embodiment, the polycrystalline silicon thin film may be formed by depositing an amorphous silicon thin film on the substrate 110 and applying various crystallizing methods, further explained below. First, the amorphous silicon may be deposited by various methods. For example, the amorphous silicon may be deposited by methods such as low pressure chemical vapor deposition (LPCVD) and plasma enhanced chemical vapor deposition (PECVD). The crystallization may be performed after a dehydrogenation process to remove hydrogen atoms that exist within the amorphous silicon thin film. Methods for crystallizing the amorphous silicon thin film include a solid phase crystallization (SPC) method in which the amorphous silicon thin film is heat-treated at a furnace of high temperature, and an eximer laser annealing (ELA) method using a laser. The laser crystallization usually uses an eximer laser annealing method, which uses a pulse type laser. Currently, a sequential lateral solidification (SLS) method in which a grain is grown in the horizontal direction to improve crystallization characteristics is under research. Using one of these methods, the lateral surfaces of the active pattern 124 are formed to have a sawtooth-like pattern.

Figure 8B:
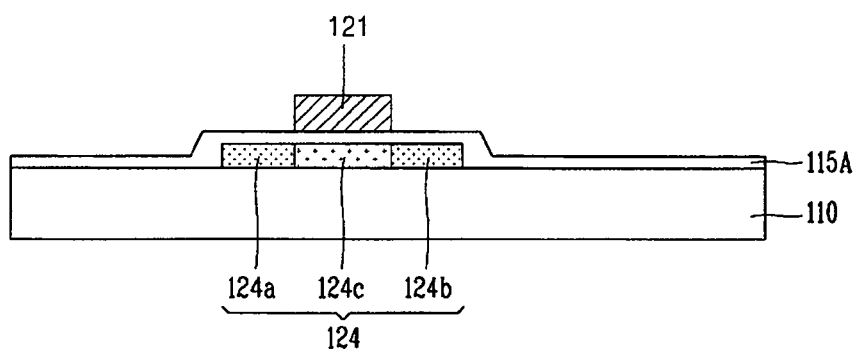

As shown in FIG. 8B, a first insulating layer 115A and a first conductive layer (not shown) are sequentially formed on an entire surface of the substrate 110 on which the active pattern 124 has been formed. The first conductive layer may be formed of an opaque conductive material having a low resistance. Examples of opaque conductive materials having low resistance include aluminum (Al), Al alloy, tungsten (W), copper (Cu), chromium (Cr), and molybdenum (Mo). A photolithography process is then used to selectively pattern the first conductive layer, thereby forming a gate electrode 121 and a gate line 116 (FIG. 7) on the substrate 110. As aforementioned, the lateral surfaces of the active pattern 124 have a sawtooth shape. The sawtooth shaped active pattern 124 have an increased contact area between the active pattern 124 (i.e., the lower layer) and the gate electrode 121 (i.e., the upper layer). By increasing the contact area between the upper and lower layers, a flow path of the etching solution is lengthened during the patterning of the lower layer. As a result, even when a void V is formed at an interface between the upper and lower layers, the disconnection in the upper layer can be prevented.

After forming the gate electrode 121 and the gate line 116, the gate electrode 121 is used as a mask to inject an impurity ion into a region of the active pattern 124, thereby forming a source region 124a and a drain region 124b to form ohmic contact layers. Here, the gate electrode 121 is used as an ion mask to prevent a dopant from being introduced into the channel region 124c of the active pattern 124. The electrical feature of the active pattern 124 may be changed according to the type of the dopant injected. If the injected dopant is an element of a third group in the periodic table, such as boron (B), the active pattern 124 operates as a P-type thin film transistor. On the other hand, if the injected dopant is an element of a fifth group in the periodic table, such as phosphorus (P), the active pattern 124 operates as an N-type thin film transistor. Finally, a process for activating the injected dopant may be performed after the ion injecting process.

Figure 8C:
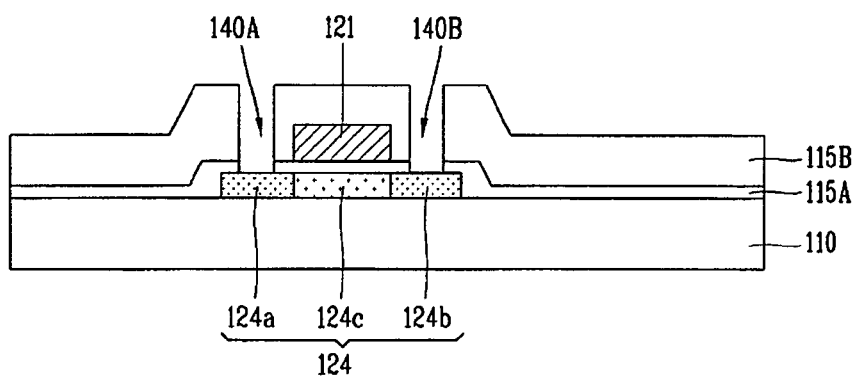

As shown in FIG. 8C, a second insulating layer 115B is deposited on the entire surface of the substrate 110 on which the gate electrode 121 and the gate line 116 have been formed. Afterwards, a photolithography process is used to remove partial regions of the first insulating layer 115A and the second insulating layer 115B to form a first contact hole 140A, which partially exposes the source region 124a, and a second contact hole 140B, which partially exposes the drain region 124b. The second insulating layer 115B may be formed of a transparent organic insulating material such as benzocyclobutene (BCB) or acryl-based resin in order to obtain a high aperture ratio.

Figure 8D:
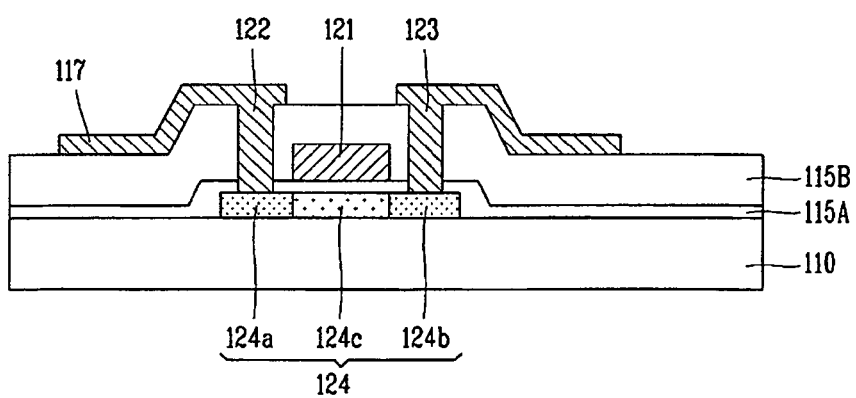

Next, as shown in FIG. 8D, a second conductive layer (not shown) is deposited on the entire surface of the substrate 110. A photolithography process is then used to selectively pattern the second conductive layer, thereby forming a source electrode 122 that is electrically connected to the source region 124a through the first contact hole 140A, and a drain electrode 123 that is electrically connected to the drain region 124b through the second contact hole 140B. Here, the source electrode 122 is partially extended in one direction to form the data line 117.

Figure 8E:
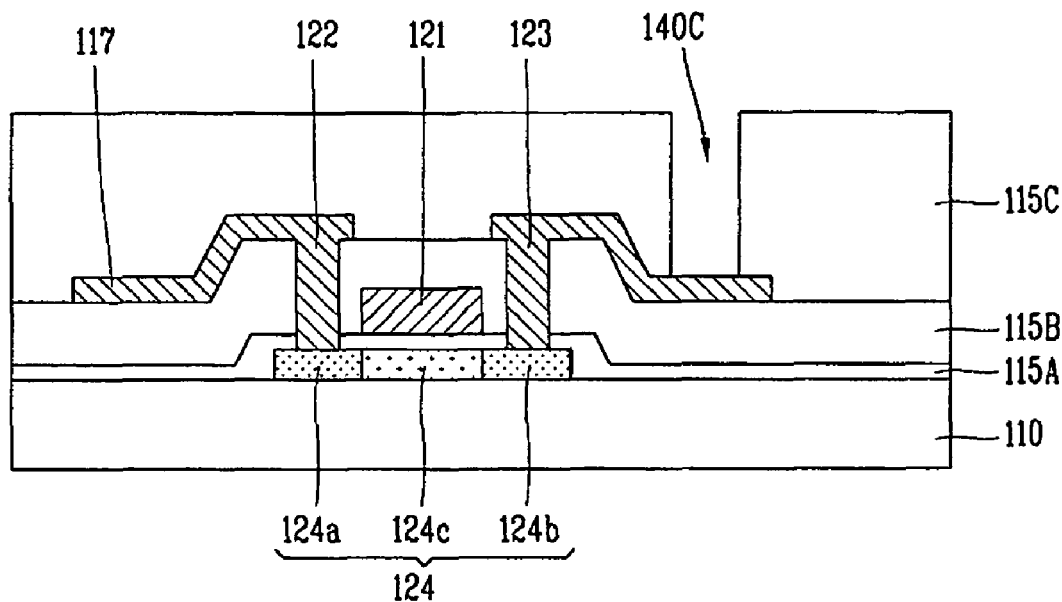

As shown in FIG. 8E, a third insulating layer 115C is deposited on the entire surface of the substrate 110. A photolithography process is then used to form a third contact hole 140C that partially exposes the drain electrode 123.

Figure 8F:
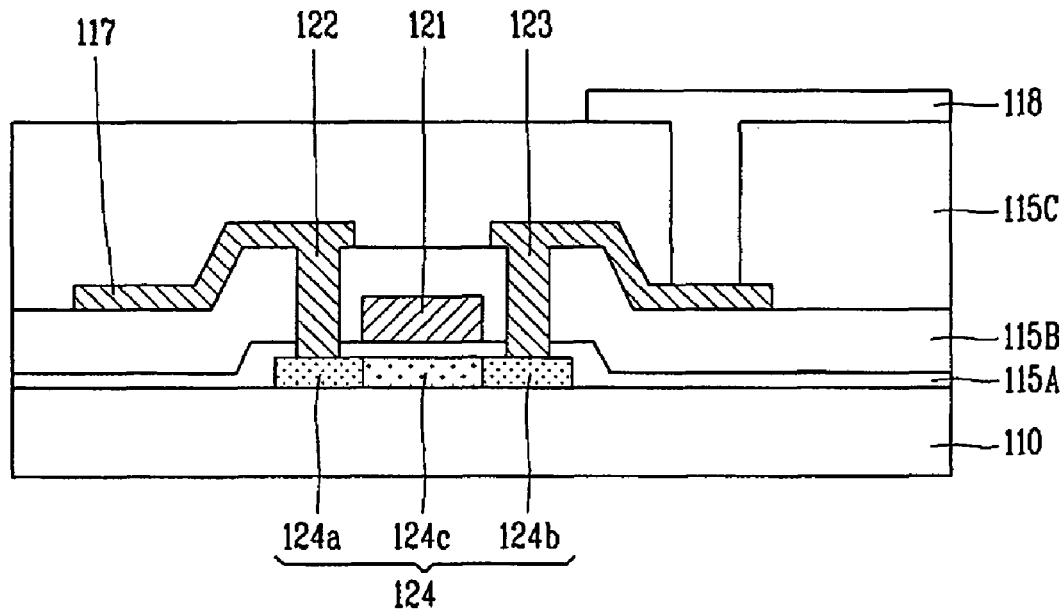

As shown in FIG. 8F, a third conductive layer (not shown) is formed on the entire surface of the substrate 110 after the third insulating layer 115C has been formed. A photolithography process is then used to pattern the third conductive layer, thereby forming the pixel electrode 118, which is electrically connected to the drain electrode 123 through the contact hole 140C.

It will be apparent to those skilled in the art that various modifications and variations can be made in the liquid crystal display device and fabrication method thereof of the present invention without departing from the sprit or scope of the invention. Thus, it is intended that the present invention covers the modifications and variations of this invention provided they come within the scope of the appended claims and their equivalents.

What is claimed is:

1. A method for fabricating an array substrate for a liquid crystal display device, the method comprising: forming an active pattern as a lower layer to have a plurality of triangular sawteeth patterns and an inclined angle at both sides on a substrate; forming a first insulating layer on the substrate on which the active pattern is formed; forming a gate electrode as an upper layer on the active pattern on which the first insulating layer is formed, the gate electrode crossing the plurality of triangular sawteeth patterns of the active pattern; lengthening a flow path, within a void at an interface between the active pattern and the gate electrode, through which an etching solution is introduced by the plurality of triangular sawteeth patterns and the inclined angle at the both sides of the active pattern during the forming of the gate electrode; forming a second insulating layer on the substrate on which the gate electrode is formed; forming a source electrode and a drain electrode connected to the active pattern; forming a third insulating layer on the source electrode and the drain electrode; and forming a pixel electrode connected to the drain electrode.

2. The method of claim 1, wherein the active pattern is formed of a silicon thin film.

* * * * *